United States Patent [19]
Kamiguchi et al.

[11] Patent Number: 5,962,905
[45] Date of Patent: Oct. 5, 1999

[54] MAGNETORESISTIVE ELEMENT

[75] Inventors: Yuzo Kamiguchi; Masashi Sahashi, both of Yokohama, Japan

[73] Assignee: Kabushiki Kaisha Toshiba, Kawasaki, Japan

[21] Appl. No.: 08/931,419

[22] Filed: Sep. 16, 1997

[30] Foreign Application Priority Data

Sep. 17, 1996 [JP] Japan ................................. 8-245059

[51] Int. Cl.$^6$ .............................. H01L 29/82; H01L 43/00
[52] U.S. Cl. ......................... 257/421; 257/422; 257/423; 257/427
[58] Field of Search ................................. 257/421, 422, 257/423, 427

[56] References Cited

U.S. PATENT DOCUMENTS

| | | | |
|---|---|---|---|
| 4,700,211 | 10/1987 | Popvoc et al. ........................... | 357/27 |
| 5,262,666 | 11/1993 | Yoshino et al. ......................... | 257/427 |
| 5,329,480 | 7/1994 | Wu et al. ................................ | 365/170 |
| 5,416,353 | 5/1995 | Kamiguchi et al. .................... | 257/421 |

OTHER PUBLICATIONS

I. Solomon, "Spin–Dependent Recombination in a Silicon p–n Junction", Solid State Communications, vol. 20, pp. 215–217, 1976.

Supriyo Data et al, "Electronic Analog of the Electro–Optic Modulator", Appl. Phys. Lett. 56(7), pp. 665–667, Feb. 12, 1990.

*Primary Examiner*—William Mintel
*Attorney, Agent, or Firm*—Oblon, Spivak, McClelland, Maier & Neustadt, P.C.

[57] ABSTRACT

A magnetoresistive element comprises an n-type emitter layer, a p-type base layer, and an n-type collector layer, the three layers being so arranged as to form a pn-junction with each other, an emitter ferromagnetic layer formed in contact with the n-type emitter layer, a base ferromagnetic layer formed in contact with the p-type base layer, a power source for applying, by way of the emitter ferromagnetic layer, a forward bias voltage between the n-type emitter layer and the p-type base layer, a power source for applying a backward bias voltage to the n-type collector layer and the p-type base layer and a power source for applying, by way of the base ferromagnetic layer, a bias voltage so as to inject minority carriers into the p-type base layer.

15 Claims, 3 Drawing Sheets

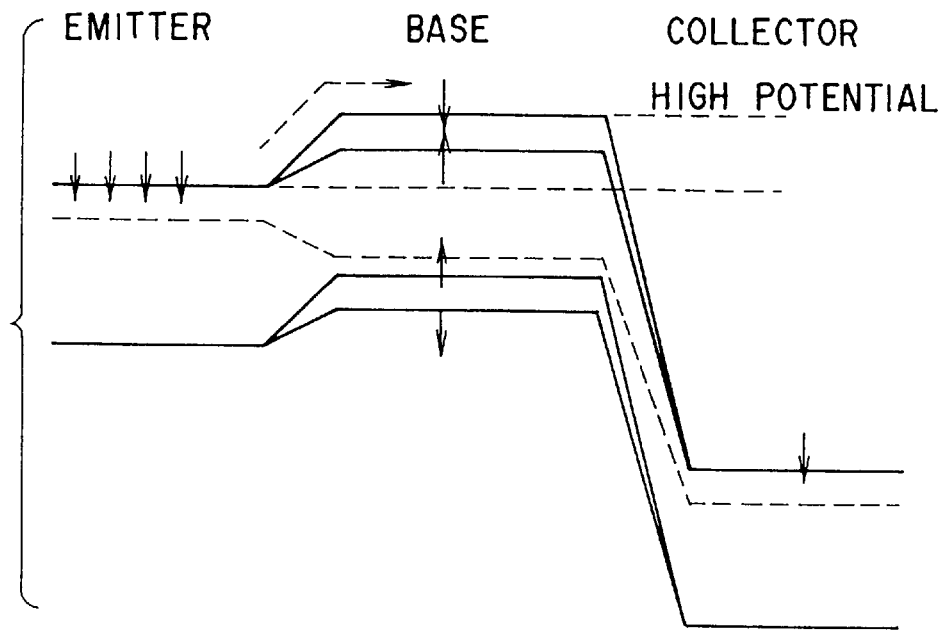
F I G. 4A
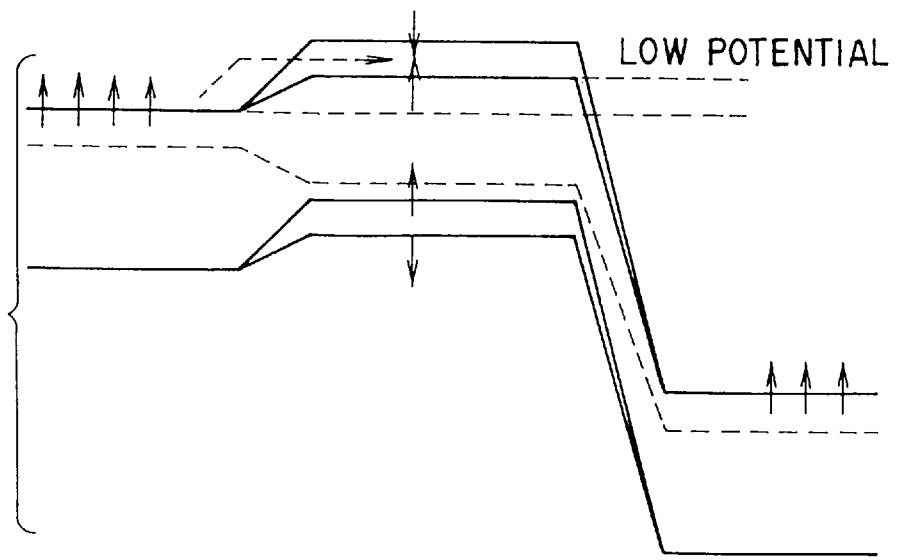
F I G. 4B

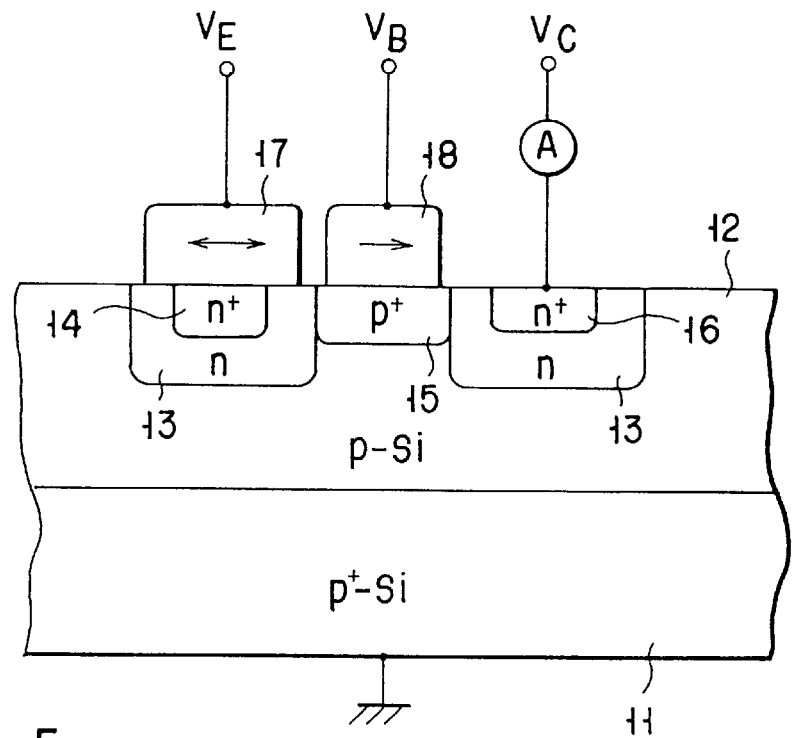
F I G. 5
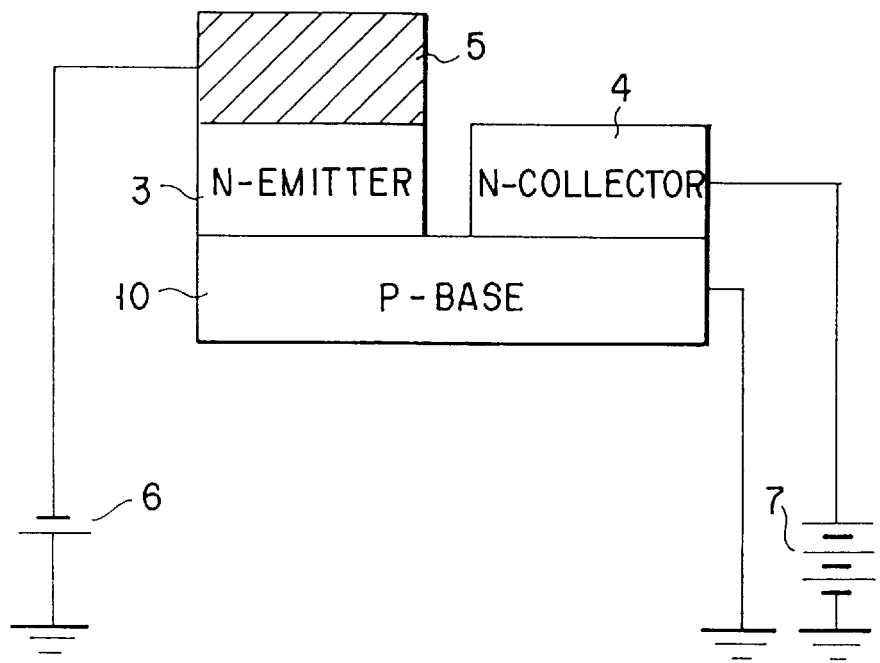
F I G. 6

MAGNETORESISTIVE ELEMENT

BACKGROUND OF THE INVENTION

The present invention relates to a magnetoresistive element.

In recent years, massive efforts have been made to develop elements utilizing spin polarization of conduction electrons in a ferromagnetic material. A typical example of such devices is a spin valve type magnetoresistive element (Phys. Rev. B, 43 (1991) 1297). A spin valve type magnetoresistive element has a structure obtained by stacking first and second ferromagnetic layers (such as NiFe and Co), each having a thickness of about 5 to 10 nm, with an intervening non-magnetic layer (such as Cu) having a thickness of about 2 to 5 nm between them and further stacking an antiferromagnetic layer (such as FeMn) on one of the ferromagnetic layers. In this structure, the magnetization direction of the ferromagnetic layer in contact with the antiferromagnetic layer is fixed and only that of the ferromagnetic layer not in contact with the FeMn layer changes according to a signal magnetic field. The element shows a high resistance when the magnetization directions of the upper and lower ferromagnetic layers are in anti-parallel alignment due to spin-dependent scattering and shows a low resistance when they are in parallel alignment because no such scattering occurs. Thus, the resistance of the element can vary remarkably vary between the two states.

However, the change in the resistance of a spin valve type magnetoresistive element does not greatly exceed 10%. Additionally, since each of the layers of the spin valve type magnetoresistive element are made of metal, its specific resistance is low and hence a large current density is required to obtain a sufficiently large signal output from the element. This means that the heat generated in the element becomes a problem when the element is miniaturized to integrate the elements at a high density.

Recently, there has been proposed an element called a spin transistor. The spin transistor basically has a three-layered structure of ferromagnetic layer/non-magnetic layer/ferromagnetic layer and operates in a manner as described below. Spin-polarized electrons are injected into the non-magnetic layer (for example, Cu) from one of the ferromagnetic layers to bring the non-magnetic layer into a non-equilibrium state, which is detected by observing the potential difference between the other ferromagnetic layer and the non-magnetic layer. Under this condition, a positive potential is observed when the magnetization directions of the two ferromagnetic layers are in parallel alignment, whereas a negative potential is observed when they are in anti-parallel alignment. Since the relative magnetization directions of the two ferromagnetic layers can be transformed into a potential difference, such an element can be used as a magnetoresistive element or a transistor.

However, since all the layers of a spin transistor are made of metal, it can produce only an output voltage of about 1 mV when it has a size of 1 $\mu m^2$. Additionally, such a transistor barely provides an amplifying effect.

In view of the above described circumstances, the inventors of the present invention proposed a magnetoresistive element comprising a pnp transistor and first and second ferromagnetic layers formed in contact with an emitter layer and a base layer, respectively, and designed to utilize the spin-dependent recombination of carriers.

With such an element, the recombination time is required to be shorter than the spin relaxation time in order to utilize the spin-dependent recombination. Hence, it is accompanied by a problem that it cannot provide a large rate of output change if an indirect transition semiconductor such as Si is used. There is a need to improve the effect of such an element by minimizing the above identified problem.

BRIEF SUMMARY OF THE INVENTION

It is therefore an object of the present invention to provide a magnetoresistive element that can provide a large output and show an amplifying effect.

A magnetoresistive element according to the present invention comprises a first semiconductor layer of a first conductivity type, a second semiconductor layer of a second conductivity type, and a third semiconductor layer of the first conductivity type, the first, second and third semiconductor layers being so arranged as to form a pn-junction with each other; a first ferromagnetic layer formed in contact with the first semiconductor layer of the first conductivity type; a second ferromagnetic layer formed in contact with the second semiconductor layer of the second conductivity type; means for applying, by way of the first ferromagnetic layer, a forward bias voltage between the first semiconductor layer of the first conductivity type and the second semiconductor layer of the second conductivity type; means for applying a backward bias voltage between the third semiconductor layer of the first conductivity type and the second semiconductor layer of the second conductivity type; and means for applying, by way of the second ferromagnetic layer, a bias voltage so as to inject minority carriers into the second semiconductor layer.

Another magnetoresistive element of the present invention comprises a first semiconductor layer of a first conductivity type, a second magnetic semiconductor layer of a second conductivity type, and a third semiconductor layer of the first conductivity type, the first, second and third semiconductor layers being so arranged as to form a pn-junction with each other; and a first ferromagnetic layer formed in contact with the first semiconductor layer of the first conductivity type.

BRIEF DESCRIPTION OF THE SEVERAL VIEWS OF THE DRAWING

FIG. 4A and FIG. 4B are energy band diagrams of the magnetoresistive element of FIG. 1 under a condition where spin-polarized electrons are injected into the base layer and bias voltages are applied to the npn transistor;

FIG. 5 is a schematic view of the magnetoresistive element in Example 2 of the present invention; and FIG. 6 is a schematic view of the magnetoresistive element in Example 3 of the present invention.

DETAILED DESCRIPTION OF THE INVENTION

The present invention will be described in detail hereinafter.

Figure 1:
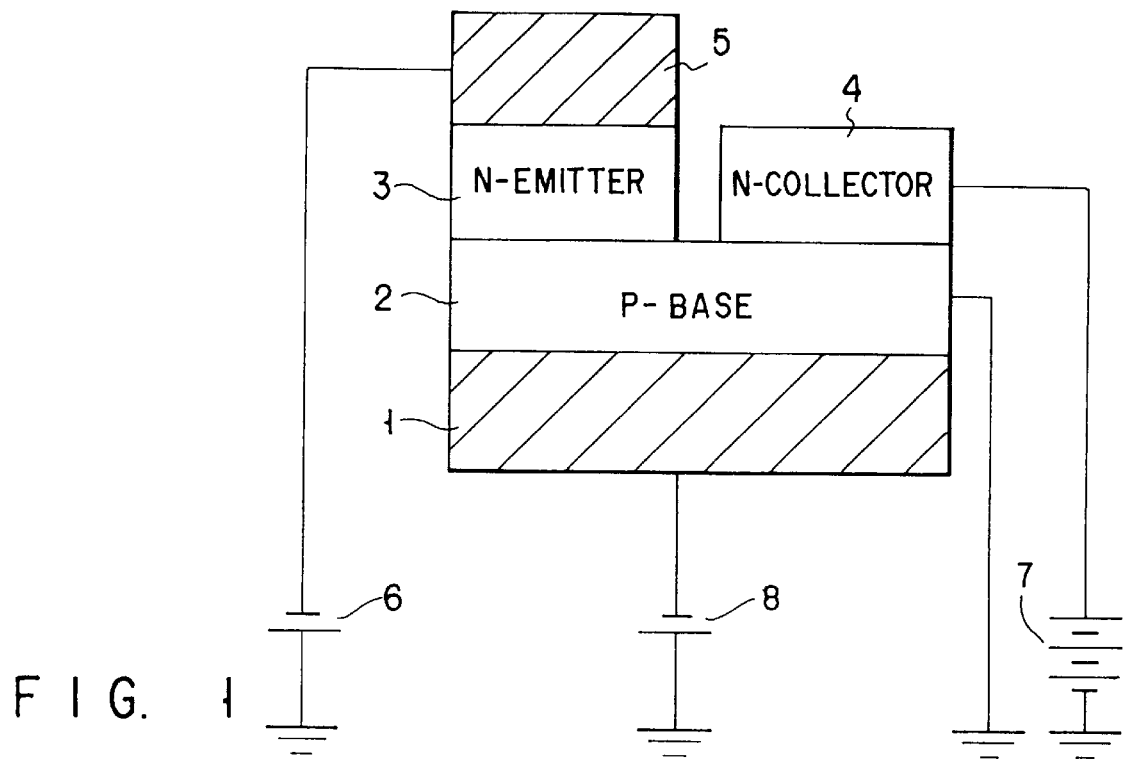
FIG. 1 is a schematic view of a magnetoresistive element according to the present invention.

FIG. 1 is a schematic view of a magnetoresistive element according to the present invention. The magnetoresistive element shown in this figure has a structure in which two ferromagnetic layers are formed so as to be in contact with a base layer and an emitter layer of npn transistor, respectively. Referring to FIG. 1, a p-type base layer (second semiconductor layer of the second conductivity type) 2 is formed on a base ferromagnetic layer (second ferromagnetic layer) 1. An n-type emitter layer (first semiconductor layer of the first conductivity type) 3 and an n-type collector layer (third semiconductor layer of the first conductivity type) are formed on the p-type base layer 2 and separated from each other. An emitter ferromagnetic layer (first ferromagnetic layer) 5 is formed on the n-type emitter layer 3. The p-type base layer is grounded and there are provided a power source 6 for applying, by way of the first ferromagnetic layer 5, a forward bias voltage between the n-type emitter layer 3 and the p-type base layer 2, another power source 7 for applying a backward bias voltage to the n-type collector layer 4 and the p-type base layer 2 and still another power source 8 for applying, by way of the second ferromagnetic layer 1, a bias voltage to the p-type base layer 2 to inject minority carriers. Thus, a magnetoresistive element according to the present invention is a four-terminal element. In addition, the magnetization direction of, for example, the base ferromagnetic layer 1 is fixed, whereas that of the emitter ferromagnetic layer 5 is free and can be rotated according to the direction of the external magnetic field.

Note that the magnetoresistive element according to the present invention may be formed by using a pnp transistor. Also note that layered structure of the first through third semiconductor layers and means for applying bias voltages may be modified appropriately.

Figure 2:
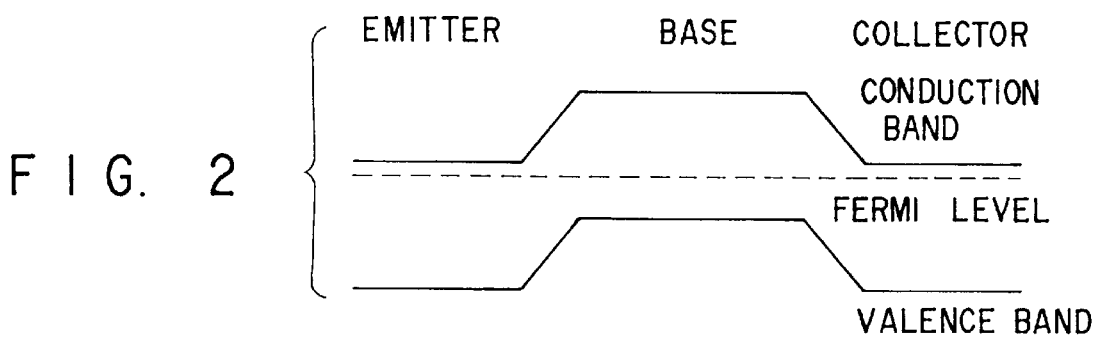
FIG. 2 is an energy band diagram of the magnetoresistive element of FIG. 1 under a no bias condition.
Figure 3:
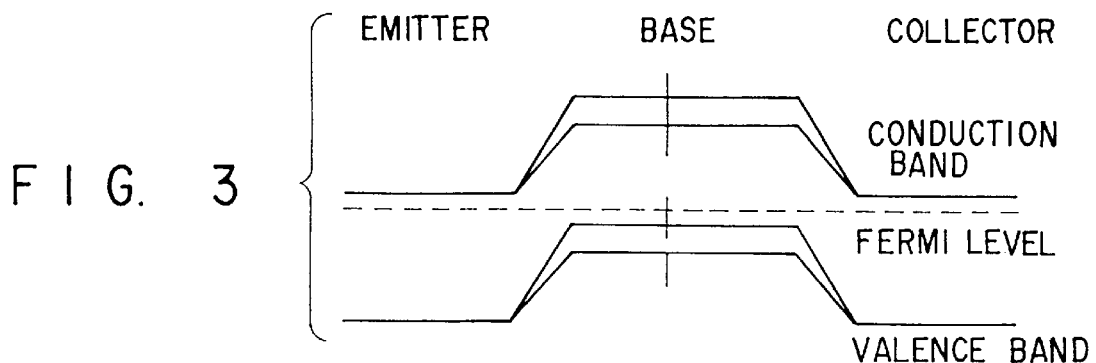
FIG. 3 is an energy band diagram of the magnetoresistive element of FIG. 1 under a condition where spin-polarized electrons are injected into the base layer.

The operation of the above described magnetoresistive element will be described by referring to FIGS. 2 through 4 showing the energy band diagrams.

FIG. 2 is an energy band diagram under a no bias condition. The energy band diagram is same as that of an npn bipolar transistor.

FIG. 3 is an energy band diagram under a condition where spin-polarized minority carriers (electrons in this case) are injected into the base layer by applying a bias voltage between the base ferromagnetic layer 1 and the base layer 2. The spin-polarized electrons injected into the base layer 2 are transmitted through the base layer 2 by diffusion or drift, maintaining the spin-polarized state during a time period substantially corresponding to the spin relaxation time. Consequently, a non-equilibrium state of spins is generated in the base layer 2 to give rise to a phenomenon of band splitting due to up-spin and down-spin, the extent of which corresponds to the Zeeman energy. Therefore, there arises a potential difference between the up-spin electrons and the down-spin electrons in the base layer 2.

FIG. 4A and FIG. 4B are energy band diagrams under a condition where spin-polarized electrons are injected into the base layer as shown in FIG. 3 and further bias voltages corresponding to the grounded base circuit of the npn transistor are applied. FIG. 4A is a diagram showing the case where the magnetization directions of the emitter ferromagnetic layer 5 and the base ferromagnetic layer 1 are in parallel with each other, i.e. both being down-spin. In this case, since the electrons injected into the base layer 2 from the emitter layer 3 by way of the emitter ferromagnetic layer 5 have to ride over a higher potential barrier, the amount of electric current flowing to the collector layer 4 is reduced. On the other hand, FIG. 4B is a diagram showing the case where the magnetization directions of the emitter ferromagnetic layer 5 and the base ferromagnetic layer 1 are anti-parallel with each other. In this case, since the electrons injected into the base layer 2 from the emitter layer 3 by way of the emitter ferromagnetic layer 5 only need to ride over a low potential barrier, a large electric current flows to the collector layer 4. Thus, the element can be used as a magnetoresistive element because the collector current changes remarkably according to the relative angle between the magnetization directions of the emitter ferromagnetic layer 5 and the base ferromagnetic layer 1.

Since the magnetoresistive element of the present invention can directly amplify the electric current by means of the circuit operation of the transistor, utilizing the non-equilibrium state (spin splitting) of the spin-polarized carriers injected into the base layer from the base ferromagnetic layer, it can provide a large signal output and a large amplification factor. Additionally, since a magnetoresistive element of the present invention does not utilize a spin-dependent recombination effect, it can provide a large rate of output change even if an indirect transition semiconductor such as Si is used. Moreover, a large rate of output change that has not hitherto been achievable can be realized by using a direct transition semiconductor such as GaAs and increasing the number of carriers injected into the base layer.

In the present invention, a ferromagnetic material selected from Fe, Co, Ni and alloys thereof may be used for the ferromagnetic layer. Alternatively, it is preferable to use a ferromagnetic material having a larger rate of spin polarization including, for example, PtmnSb, NiMnSb, CoMnSb and alloys thereof; $Fe_3O_4$, $CoFe_2O_4$, $MnFe_2O_4$ and alloys thereof; $CrO_2$, $KCrSe_2$ and half metals other than these; and a material prepared by adding a small amount of additive element to any of above-mentioned materials.

In the present invention, it is preferable that the ferromagnetic layer and the semiconductor layer form ohmic contact in order to enhance the injection efficiency of spin-polarized carriers from the ferromagnetic layer into the semiconductor layer.

The two ferromagnetic layers have to be arranged within a range where the carriers maintain a spin-polarized state. Therefore, the two ferromagnetic layers are separated from each other by a distance less than 1 $\mu$m.

In the present invention, a semiconductor material selected from Si, Ge and a compound semiconductor (such GaAs and ZnSe), to which a p-type or n-type dopant is added, may be used for the semiconductor layer.

Alternatively, as a material for the semiconductor layer, a semimagnetic semiconductor (or diluted magnetic semiconductor) such as ZnMnSe, HgMnSe and CdMnTe may be used. In the semimagnetic semiconductor, when the conduction electrons are spin-polarized, a larger energy band splitting is produced because of magnetic atoms added to a semiconductor. Consequently, a larger output change can be provided in the case where the semimagnetic semiconductor is used, compared with the case where the general semiconductor is used.

In the present invention, a magnetic semiconductor such as FeP may be used for the base layer. The base layer consisting of the magnetic semiconductor produces a large energy band splitting because of spontaneous magnetization. In this case, it is not necessary to form a base ferromagnetic layer in contact with the base layer and to inject minority carriers, by way of the base ferromagnetic layer, into the base layer. Therefore, a magnetoresistive element having such a structure can be operated in the same manner as a general bipolar transistor.

As the magnetic semiconductor, a material such as spinel ferrite and chalcogenide spinel may be used. Specific examples are $FeCr_2F_4$, $CdCr_2S_4$, $HgCr_2S_4$, pseudo-binary alloys thereof, and alloys prepared by adding a fourth element to any of above-mentioned materials.

EXAMPLES

Example 1

A magnetoresistive element shown in FIG. 1 is prepared in the following manner. A base ferromagnetic layer 1 made of CoPt having a coercive force of 1 kOe and a thickness of 50 nm is formed on an insulating substrate (not shown). A p-type base layer 2 made of p-type GaAs having a thickness of 20 nm is formed on the base ferromagnetic layer 1. An n-type emitter layer 3 and an n-type collector layer 4, each made of n-type GaAs having a thickness of 20 nm, are formed on the p-type base layer 2. An emitter ferromagnetic layer 5 made of CoFe having a coercive force of 10 Oe and a thickness of 10 nm is formed on the n-type emitter layer 3. The p-type base layer 2 is grounded. A power source 6 for applying, by way of the first ferromagnetic layer 5, a forward bias voltage between the n-type emitter layer 3 and the p-type base layer 2, a power source 7 for applying a backward bias voltage to the n-type collector layer 4 and the p-type base layer 2 and a power source 8 for applying, by way of the second ferromagnetic layer 1, a bias voltage so as to inject minority carriers into the p-type base layer 2 are arranged. The magnetization direction of the base ferromagnetic layer 1 is fixed. On the other hand, that of the emitter ferromagnetic layer 5 is free and can be rotated according to the direction of the external magnetic field.

When the magnetoresistive element is operated, the following result is obtained. If an external magnetic field less than 1 kOe is applied parallel with the magnetization direction of the base ferromagnetic layer 1, the magnetization directions of the base ferromagnetic layer 1 and the emitter ferromagnetic layer 5 are made parallel with each other to reduce the collector current. On the other hand, if an external magnetic field less than 1 kOe is applied anti-parallel with the magnetization direction of the base ferromagnetic layer 1, the magnetization directions of the base ferromagnetic layer 1 and the emitter ferromagnetic layer 5 are made anti-parallel with each other to raise the collector current.

Example 2

A magnetoresistive element shown in FIG. 5 is prepared in the following manner. A p-type silicon layer 12 is grown epitaxially on a low resistance p+-type silicon substrate 11. An n-well 13 for an emitter and a collector is formed in the p-type silicon layer 12, and then an n+-type emitter 14, an n+-type collector 16 and a p+-type base 15 are formed. Then, an emitter ferromagnetic layer 17 made of CoFe with Hc=10 Oe is formed on the n+-type emitter 14 and a base ferromagnetic layer 18 made of CoFe with Hc=1 kOe is formed on the p+-type base layer 15. Thereafter, a 2 kOe magnetic field is applied to the element rightwardly in FIG. 5 to turn the magnetization direction of the base ferromagnetic layer 18 made of CoFe rightwardly.

When the magnetoresistive element is operated, the following result is obtained. If a base voltage of $V_B$=0.2 V is applied and spin-polarized electrons are injected into the base, the bands of up-spin electrons and down-spin electrons split in the base. An emitter voltage of $V_E$=0.5 V and a collector voltage of $V_C$=−3 V are applied under this condition and the collector current is measured. As a result, the collector current is 10 mA when the magnetization directions of the emitter ferromagnetic layer 17 and the base ferromagnetic layer 18 are parallel with each other, whereas it is 80 mA when the magnetization directions of the emitter ferromagnetic layer 17 and the base ferromagnetic layer 18 are anti-parallel with each other, or an increase up to eight times is realized.

Example 3

A magnetoresistive element shown in FIG. 6 is prepared in the following manner. A p-type base magnetic semiconductor layer 10 made of a p-type magnetic semiconductor FeP having a thickness of 50 nm is formed on an insulating substrate (not shown). An n-type emitter layer 3 and an n-type collector layer 4, each made of n-type GaAs having a thickness of 20 nm, are formed on the base magnetic semiconductor layer 10. An emitter ferromagnetic layer 5 made of CoFe having a coercive force of 10 Oe and a thickness of 10 nm is formed on the n-type emitter layer 3. The p-type base layer 2 is grounded. A power source 6 for applying, by way of the emitter ferromagnetic layer 5, a forward bias voltage between the n-type emitter layer 3 and the p-type base magnetic semiconductor layer 10, and a power source 7 for applying a backward bias voltage to the n-type collector layer 4 and the p-type base magnetic semiconductor layer 10 are arranged. The magnetization direction of the p-type base magnetic semiconductor layer is fixed. On the other hand, that of the emitter ferromagnetic layer 5 is free and can be rotated according to the direction of the external magnetic field.

When the magnetoresistive element is operated, the following result is obtained. If an external magnetic field less than 500 Oe is applied parallel with the magnetization direction of the base magnetic semiconductor layer, the magnetization directions of the base magnetic semiconductor layer and the emitter ferromagnetic layer are made parallel with each other to reduce the collector current. On the other hand, if an external magnetic field less than 500 Oe is applied anti-parallel with the magnetization direction of the base magnetic semiconductor layer, the magnetization directions of the base magnetic semiconductor layer and the emitter ferromagnetic layer are made anti-parallel with each other to raise the collector current.

We claim:

1. A magnetoresistive element comprising:
    a first semiconductor layer of a first conductivity type, a second semiconductor layer of a second conductivity type, and a third semiconductor layer of the first conductivity type, said first, second and third semiconductor layers being so arranged as to form a pn-junction with each other;
    a first ferromagnetic layer formed in contact with the first semiconductor layer of the first conductivity type;
    a second ferromagnetic layer formed in contact with the second semiconductor layer of the second conductivity type;
    a first power source for applying, by way of the first ferromagnetic layer, a forward bias voltage between the first semiconductor layer of the first conductivity type and the second semiconductor layer of the second conductivity type;
    a second power source for applying a backward bias voltage between the third semiconductor layer of the first conductivity type and the second semiconductor layer of the second conductivity type; and
    a third power source for applying, by way of the second ferromagnetic layer, a bias voltage so as to inject minority carriers into the second semiconductor layer.

2. The magnetoresistive element according to claim 1, wherein the first semiconductor layer of the first conductivity type operates as an emitter layer, the second semiconductor layer of the second conductivity type operates as a base layer, and the third semiconductor layer of the first conductivity type operates as a collector layer, thereby to form a bipolar transistor.

3. The magnetoresistive element according to claim 1, wherein the magnetization direction of one of the first and second ferromagnetic layers is fixed in one direction and that of the other ferromagnetic layer is free and can be rotated according to the direction of the external magnetic field.

4. The magnetoresistive element according to claim 1, wherein the first, second and third semiconductor layers are made of Si doped with a p-type or n-type dopant.

5. The magnetoresistive element according to claim 1, wherein the first, second and third semiconductor layers are made of p-type or n-type GaAs.

6. The magnetoresistive element according to claim 1, wherein the first and second ferromagnetic layers are made of an alloy containing Fe, Co or Ni.

7. The magnetoresistive element according to claim 1, wherein the first and second ferromagnetic layers are made of a material selected from a group consisting of PtMnSb, NiMnSb, CoMnSb, $Fe_3O_4$, $CoFe_2O_4$, $MnFe_2O_4$, $CrO_2$ and $KCrSe_2$.

8. The magnetoresistive element according to claim 1, wherein the second semiconductor layer is made of a semimagnetic semiconductor.

9. The magnetoresistive element according to claim 1, wherein the second semiconductor layer is made of a magnetic semiconductor.

10. The magnetoresistive element according to claim 1, wherein the ferromagnetic layer and the semiconductor layer form an ohmic contact.

11. The magnetoresistive element according to claim 1, wherein the distance between the first and second ferromagnetic layers is less than 1 $\mu$m.

12. A magnetoresistive element comprising:

a first semiconductor layer of a first conductivity type, a second magnetic semiconductor layer of a second conductivity type, and a third semiconductor layer of the first conductivity type, said first, second and third semiconductor layers being so arranged as to form a pn-junction with each other; and a ferromagnetic layer formed in contact with the first semiconductor layer of the first conductivity type.

13. The magnetoresistive element according to claim 12, further comprising:

a first power source for applying, by way of the first ferromagnetic layer, a forward bias voltage between the first semiconductor layer of the first conductivity type and the second semiconductor layer of the second conductivity type; and a second power source for applying a backward bias voltage between the third semiconductor layer of the first conductivity type and the second semiconductor layer the second conductivity type.

14. The magnetoresistive element according to claim 12, wherein the first semiconductor layer of the first conductivity type operates as an emitter layer, the second magnetic semiconductor layer of the second conductivity type operates as a base layer, and the third semiconductor layer of the first conductivity type operates as a collector layer, thereby to form a bipolar transistor.

15. The magnetoresistive element according to claim 12, wherein the magnetization direction of the second magnetic semiconductor layer of the second conductivity type is fixed in one direction and the magnetization direction of the ferromagnetic layer can be rotated according to the magnetization direction of an external magnetic field.

* * * * *